(12) United States Patent
Fife

(10) Patent No.: US 9,084,356 B2
(45) Date of Patent: Jul. 14, 2015

(54) PORTABLE ELECTRONICS CASE

(71) Applicant: Rob Fife, Mountain Home, TX (US)

(72) Inventor: Rob Fife, Mountain Home, TX (US)

(73) Assignee: Gunner Fab, LLC, Kerrville, TX (US)

( * ) Notice: Subject to any disclaimer, the term of this patent is extended or adjusted under 35 U.S.C. 154(b) by 53 days.

(21) Appl. No.: 14/077,592

(22) Filed: Nov. 12, 2013

(65) Prior Publication Data

US 2015/0133202 A1 May 14, 2015

(51) Int. Cl.
| | |
|---|---|
| H04M 1/00 | (2006.01) |
| H05K 5/04 | (2006.01) |
| H05K 7/18 | (2006.01) |
| H04M 1/11 | (2006.01) |
| H04B 1/06 | (2006.01) |

(52) U.S. Cl.
CPC . *H05K 5/04* (2013.01); *H04M 1/11* (2013.01); *H05K 7/18* (2013.01)

(58) Field of Classification Search
CPC ..................... H04B 1/3888; H04B 2001/3894
USPC .............................................. 455/90.3, 575.8
See application file for complete search history.

(56) References Cited

U.S. PATENT DOCUMENTS

| | | | | |
|---|---|---|---|---|
| 8,646,698 B2 * | 2/2014 | Chen et al. | ..................... | 235/492 |
| 2012/0001525 A1 * | 1/2012 | Ogatsu | ........................ | 312/223.1 |
| 2013/0273944 A1 * | 10/2013 | Wilson et al. | ................. | 455/457 |

\* cited by examiner

*Primary Examiner* — Lee Nguyen

(57) ABSTRACT

An improved, self-supporting portable electronics case for withstanding impact forces, dead loads and torsional forces, the case comprising a first plate having a first surface, a second surface, and at least one first sidewall defining at least one opening extending between the first surface and the second surface, and a first set of flanges. The case further includes a second plate having a third surface, a fourth surface, at least one second sidewall defining at least one opening extending between the third surface and the fourth surface, and a second set of flanges extending from the second plate; and at least one spacer joined to the first set of flanges and the second set of flanges.

8 Claims, 4 Drawing Sheets

PORTABLE ELECTRONICS CASE

CROSS REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention relates to portable electronic accessories. More specifically, the present invention is an improved portable electronics case adapted to be self-supporting and to have increased structural and live load-bearing strength relative to other such cases.

2. Description of the Related Art

With the proliferation of smaller, smarter, and more expensive electronics devices, such as mobile phones, in the last fifteen years, the portable electronics market has seen a corresponding proliferation of different portable electronics cases to protect those devices. These include compact leather and synthetic leather cases, faceplates, rubberized cases, silicone cases, single-piece, and multiple-piece cases. These cases are both aesthetic and functional, with one objective to provide protection from live or dead load forces.

While many of these existing cases are directed to reducing the damaging effect of impact from dropping the case (e.g., live load), few, if any, of the cases currently on the market address the problems associated with structural load or applied torque. Simply put, such cases are not self-supporting and may be deformed by, among other things, load or torsion in a manner that damages the contained electronics.

BRIEF SUMMARY OF THE INVENTION

The present invention provides an improved, self-supporting portable electronics case that is proficient at withstanding both impact forces and dead loads as well as the application of torque. The invention comprises a first plate having a first surface, a second surface, and at least one first sidewall defining at least one opening extending between the first surface and the second surface, and a first set of flanges; a second plate having a third surface, a fourth surface, at least one second sidewall defining at least one opening extending between the third surface and the fourth surface, and a second set of flanges extending from the second plate; at least one spacer having a length, the at least one spacer joined to the first set of flanges and the second set of flanges.

DETAILED DESCRIPTION

Figure 1:
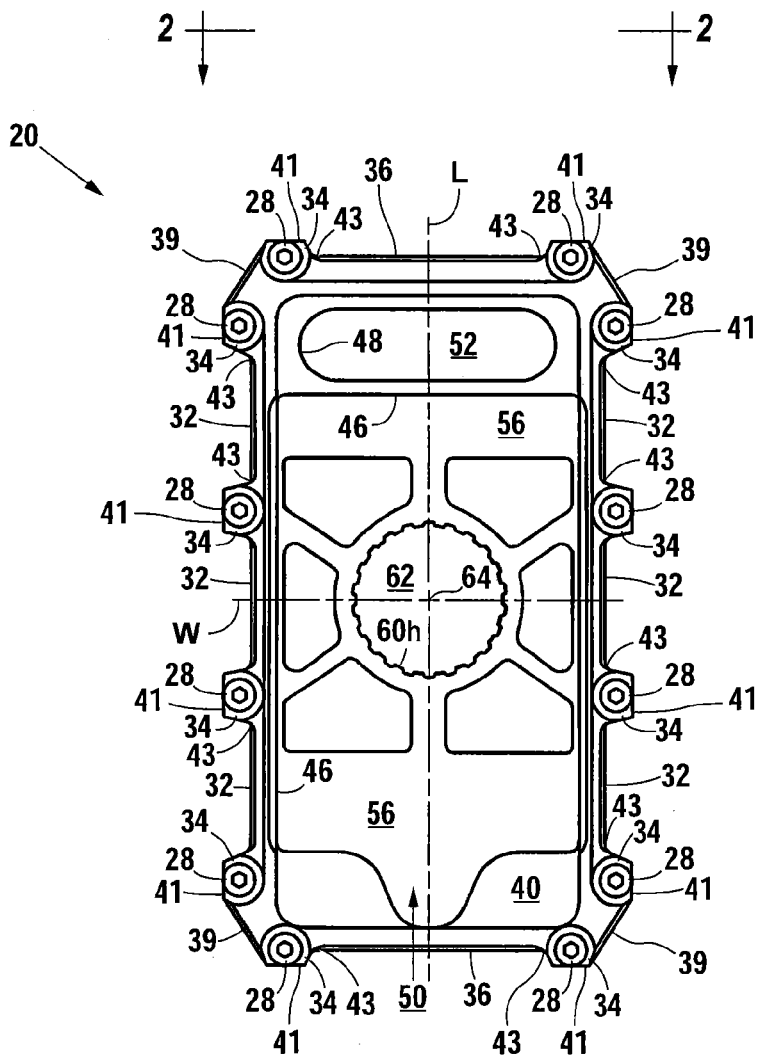
FIG. 1 is a first plan view of an embodiment of the invention.
Figure 2:
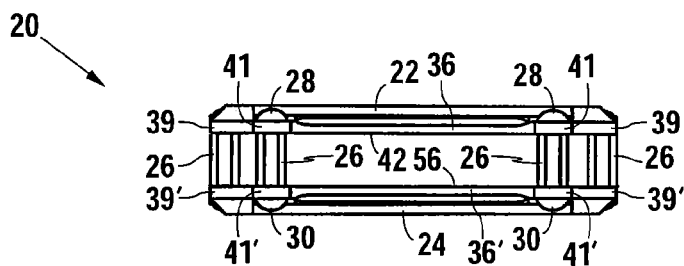
FIG. 2 shows the embodiment from line 2-2 of FIG. 1.

FIGS. 1-5 show an embodiment 20 of the invention, which comprises a first plate 22, a second plate 24, and spacers 26 fastened to the first plate 22 and the second plate 24 with a first set of screws 28 and a second set of screws 30, respectively. Each of the metal plates 22, 24 has a length along a longitudinal reference plane L and a width along a lateral reference plane W. The embodiment 20 is symmetrical about both the longitudinal plane L and the latitudinal plane W. The plates 22, 24 and spacers 26 are preferably aluminum alloy (e.g., 6061). The metal spacers 26 are female hex standoffs.

The metal plates 22, 24 comprise a plurality of longitudinal edge surfaces 32, 32' oriented parallel to the longitudinal plane L and a plurality of latitudinal edge surfaces 36, 36' oriented parallel to the latitudinal plane W. The longitudinal edge surfaces 32 of the first plate 22 are aligned with the longitudinal edge surfaces 32' of the second plate 24. Similarly, the latitudinal edge surfaces 36 of the first plate 22 are aligned with the latitudinal edge surfaces 36' of the second plate 24. A plurality of angled edge surfaces 39, 39' are angled relative to the longitudinal plane L and latitudinal plane W.

Referring specifically to FIG. 1, the first plate 22 having a first perimeter. The first plate 22 comprises a first set of flanges 34 spaced between the various edge surfaces 32, 36, 39. Each flange 34 comprises a flange edge surface 41 that is parallel to one of either the latitudinal plane W or the longitudinal plane L. The flanges 34 are joined to longitudinal edge surfaces 32 or latitudinal edge surface 36 with curved surfaces 43. For emphasis, the first perimeter comprises the longitudinal edge surfaces 32, the latitudinal edge surfaces 36, the angled surfaces 39, the flanges 34 (including flange edge surfaces 41) and curved surfaces 43.

The first plate 22 has a first surface 40 and an opposing planar second surface 42 (see FIG. 2), each of which is adjacent to the longitudinal and latitudinal edge surfaces 32, 36. The first plate 24 also includes two inner sidewalls 46, 48 defining a first opening 50 and a second opening 52 (extending between the first surface 40 and the second surface 42). When containing a portable electronic device, such as a smartphone, the first and second openings 50, 52 may provide access to controls of the device, such as a touch screen display or keyboard.

Figure 3:
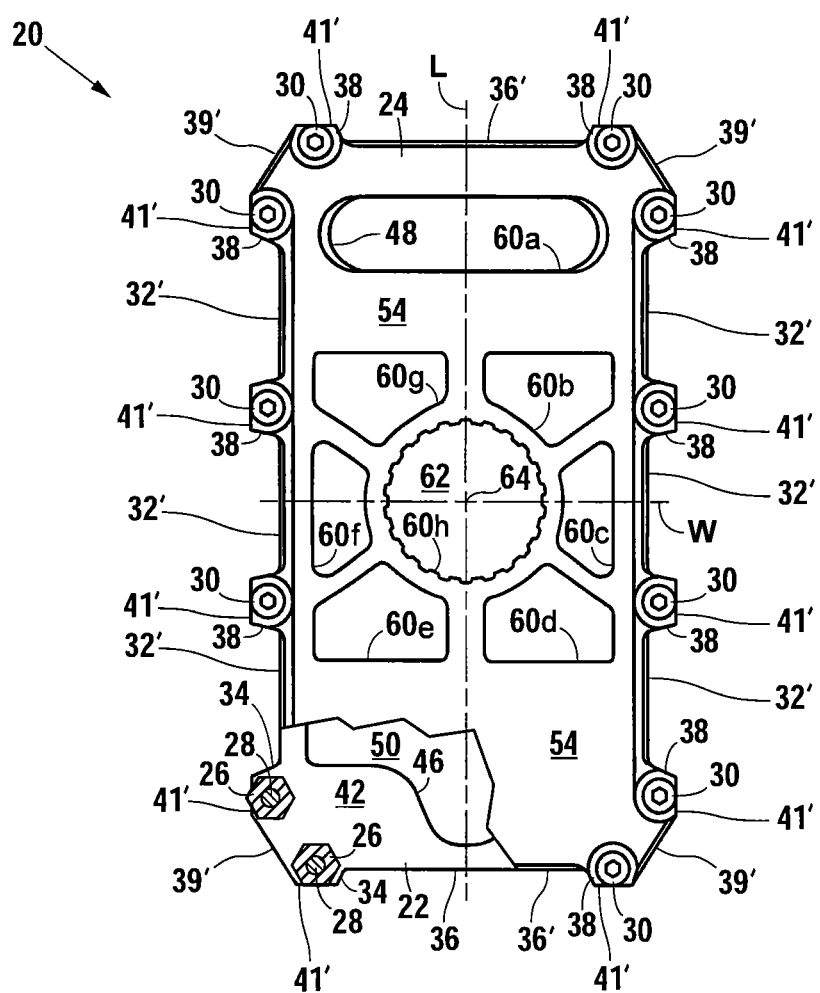
FIG. 3 shows the embodiment from line 3-3 of FIG. 2.
Figure 4:
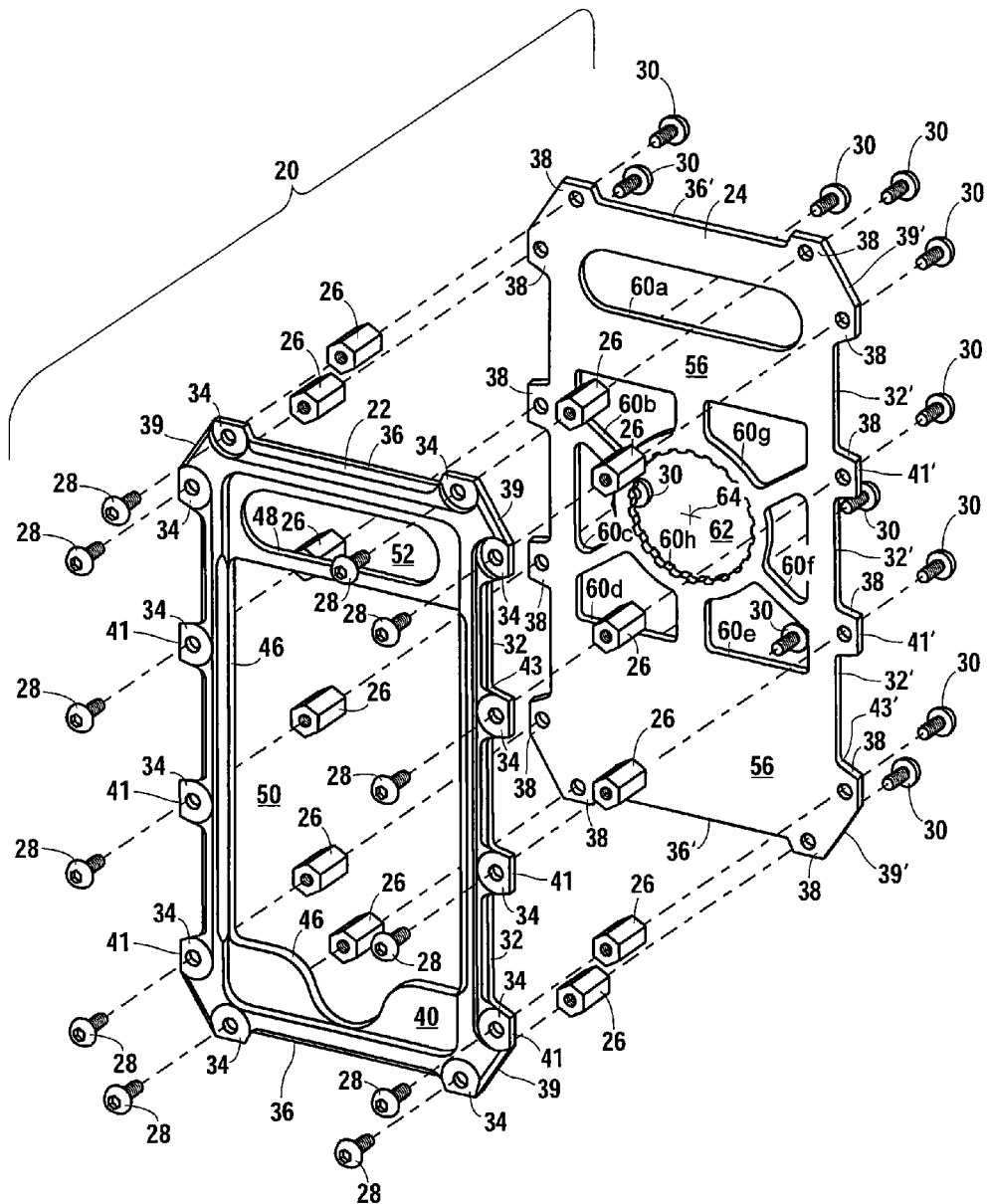
FIG. 4 is an isometric assembly view of an embodiment of the present invention.
Figure 5:
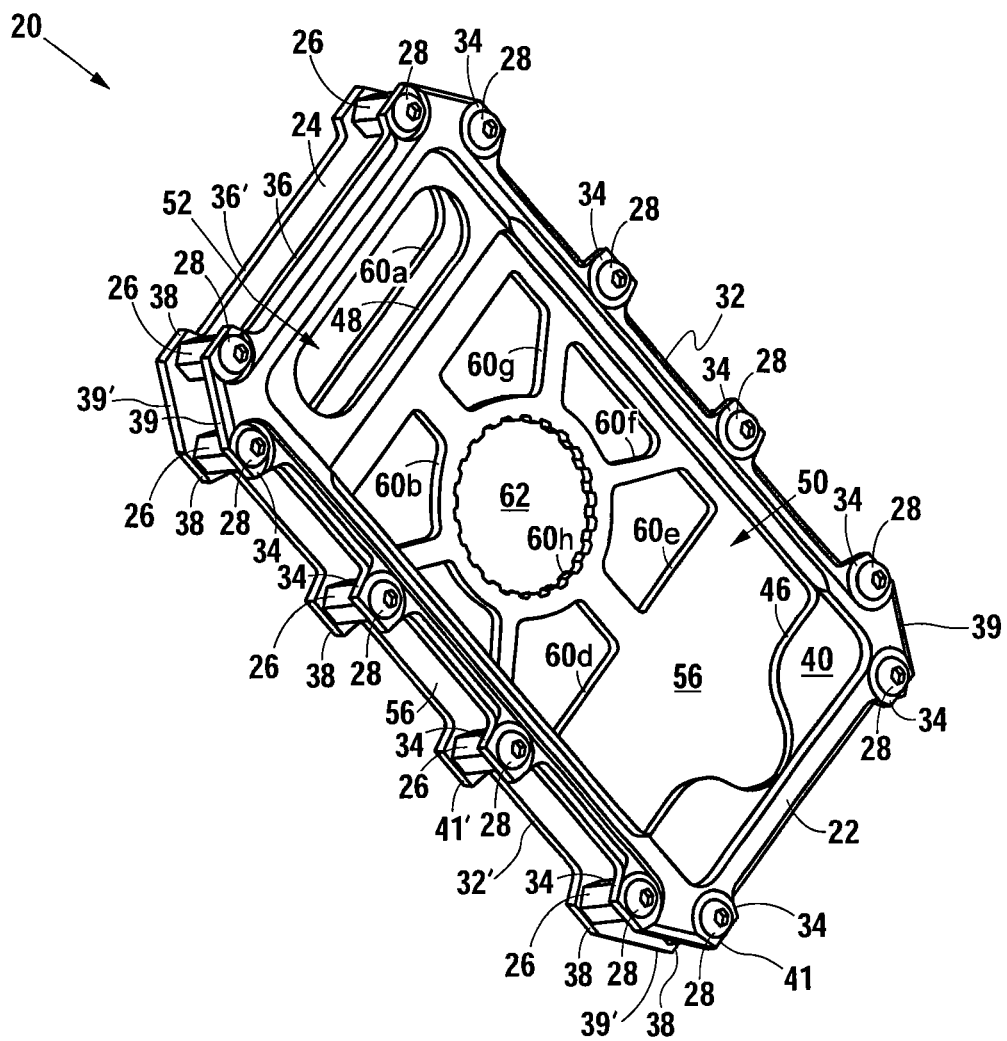
FIG. 5 is a second isometric view of the embodiment shown in FIG. 1.

Referring to FIG. 3, the second plate 24 has a second perimeter. The second plate 24 comprises a second set of flanges 38. Each flange 38 comprises a flange edge surface 41' that is parallel to one of either the longitudinal plane L or latitudinal plane W. The flanges 38 are joined to longitudinal edge surfaces 32' or latitudinal edge surfaces 36' of the second plate 24. For emphasis, the second perimeter comprises the longitudinal edge surfaces 32', the latitudinal edge surfaces 36', and the flanges 38 (including flange edge surfaces 41'), the angled surfaces 39'.

The second plate 24 has a third surface 54 and an opposing planar fourth surface 56, each of which is adjacent to the longitudinal and latitudinal edge surfaces 32', 36'. The second plate further comprises inner sidewalls 60a-h defining openings, including a central opening 62, between the third surface 54 and the fourth surface 56. The inner sidewall 60h is notched. The central opening 62 intersects with the volumetric center 64 of the second plate 24. The openings may be used to facilitate dissipation of heat generated by any contained portable electronics. In addition, the central opening 62 defined by the notched sidewall 60h may be used as a tool, such as a bottle opener.

The first and second plates 22, 24 are connected together by aligning their respective flanges 34, 38 with ends of the spacers 26 and fastening the plates 22, 24 to the spacers 26 with the screws 28, 30. In some embodiments, the plates 22, 24 are fastened to surround a second, smaller case or liner (not shown) made from a semi-rigid thermoplastic elastomer, such as are often intended to provide protection for electronics against minor bumps and abrasions. One such acceptable case is sold under the tradename EXEC IP4 by Magpul Industries Corp. of Boulder, Colo.

In the event the embodiment 20 is subjected to impact (e.g., from dropping), the shape of the embodiment 20, including the flanges 34, 38 and angled edge surfaces 39, 39', increases the likelihood that the embodiment 20, rather than the contained electronics (e.g., a phone), will absorb most of the force from impact. Use of a liner with the embodiment as described above will further inhibit transference of the forces to the contained electronics. Moreover, an impact force or load acting on one of the plates 22, 24 will be transferred to the spacers 26, particularly of the force direction is normal or near normal to the first or third surfaces 40, 54. Because the plates 22, 24 and spacers 26 are made of a soft metal, such as aluminum alloy, the embodiment 20 absorbs much of the energy resulting from the impact. In addition, the embodiment 20 is particularly strong and durable when subjected to other loads, including torque.

While the above-described embodiment is manufactured substantially from aluminum alloy, alternative embodiments contemplate the use of other materials of similar rigidity and hardness. For example, in one embodiment, the elements may be molded (e.g., injection molded) from a thermoplastic hybrid compound. In yet another embodiment, some elements of may be manufactured from aluminum alloy while other elements of the same embodiment may be manufactured from a thermoplastic hybrid compound. In still other embodiments, the thermoplastic hybrid compound may be further impregnated with carbon or glass fibers.

The present invention is described above in terms of a preferred illustrative embodiment of a specifically-described apparatus. Those skilled in the art will recognize that alternative constructions of such an apparatus can be used in carrying out the present invention. Other aspects, features, and advantages of the present invention may be obtained from a study of this disclosure and the drawings, along with the appended claims.

I claim:

1. A portable electronics case comprising:
a first plate having a first surface, a second surface, at least one first sidewall defining at least one opening extending between said first surface and said second surface, a first plurality of longitudinal edge surfaces adjacent to said first surface and said second surface, a first plurality of latitudinal edge surfaces adjacent to said first surface and said second surface and orientated perpendicularly to said first plurality of longitudinal edge surfaces, and a first set of flanges having a first plurality of flange edge surfaces angled relative to said first plurality of latitudinal edge surfaces;

a second plate having a third surface, a fourth surface, at least one second sidewall defining at least one opening extending between said third surface and said fourth surface, a second plurality of longitudinal edge surfaces adjacent to said third surface and said fourth surface, a second plurality of latitudinal edge surfaces adjacent to said third surface and said fourth surface and orientated perpendicularly to said second plurality of longitudinal edge surfaces, and a second set of flanges having a second plurality of flange edge surfaces angled relative to said second plurality of latitudinal edge surfaces; and at least one spacer having a length, said at least one spacer joined to said first set of flanges and said second set of flanges.

2. The portable electronics case of claim 1 wherein said first plate, said second plate, and said at least one spacer are aluminum alloy.

3. The portable electronics case of claim 1 wherein said at least one second sidewall defines a central opening intersecting a volumetric center of said second plate.

4. The portable electronics case of claim 1 wherein said at least one second sidewall comprises a notched sidewall defining an opening.

5. The portable electronics case of claim 1 wherein said first plate has a first thickness and said second plate has a second thickness, and wherein the length of said at least one spacer is equal to or greater than the first thickness plus the second thickness.

6. The portable electronics case of claim 1 wherein said second surface and said fourth surface are parallel planar surfaces.

7. The portable electronics case of claim 1 wherein said at least one spacer is fastened to said first set of flanges and said second set of flanges.

8. The portable electronics case of claim 1 wherein said at least one spacer is integrally formed with at least one of said first plate and said second plate.

* * * * *